United States Patent
Hsu (10) Patent No.: US 6,998,280 B2
(45) Date of Patent: Feb. 14, 2006

(54) WAFER PACKAGING PROCESS OF PACKAGING LIGHT EMITTING DIODE

(76) Inventor: Mei-Hung Hsu, 4F, No. 18, Alley 28, Lane 59, Sec. 5, Nan Ching East Road, Taipei (TW)

( * ) Notice: Subject to any disclaimer, the term of this patent is extended or adjusted under 35 U.S.C. 154(b) by 165 days.

(21) Appl. No.: 10/774,427

(22) Filed: Feb. 10, 2004

(65) Prior Publication Data

US 2005/0176160 A1    Aug. 11, 2005

(51) Int. Cl.
    *H01L 21/00*      (2006.01)
    *H01L 21/44*      (2006.01)
(52) U.S. Cl. ............... 438/26; 438/22; 438/28; 438/33; 438/614
(58) Field of Classification Search ........... 438/26, 438/28, 33, 22, 614, 612, 613, 34
See application file for complete search history.

(56) References Cited

U.S. PATENT DOCUMENTS

| | | | |
|---|---|---|---|
| 6,538,323 B1 * | 3/2003 | Sakata et al. ............ 257/737 |
| 6,593,220 B1 * | 7/2003 | Yu et al. ................. 438/612 |
| 6,835,960 B2 * | 12/2004 | Lin et al. ................ 257/81 |
| 6,860,621 B2 * | 3/2005 | Bachl et al. ............ 362/373 |
| 6,897,127 B2 * | 5/2005 | Hanaoka ................. 438/460 |
| 2002/0013098 A1 * | 1/2002 | Triepels et al. .......... 439/625 |

* cited by examiner

*Primary Examiner*—Michael Trinh
(74) *Attorney, Agent, or Firm*—Bacon & Thomas, PLLC (57) ABSTRACT

A wafer packaging process of packaging light-emitting diode is described. A first photoresist layer is coated on an uncut wafer having a plurality of pads. The first photoresist layer is etched to form a plurality of first openings until a portion of the pad within the first openings are exposed. An electroplating process is performed to fill a conductive material in the first openings to form a plurality of conductive plugs electrically connecting with the pads. A second photoresist layer is coated on a surface of the first photoresist layer. The second photoresist layer is etched to form a plurality of second openings until a portion of said conductive plugs is exposed within the second openings. The second openings are filled with a conductive resilient element. Then an electroplating process is performed. Finally, the wafer is cut to form a plurality of packaged light emitting diodes.

13 Claims, 9 Drawing Sheets

WAFER PACKAGING PROCESS OF PACKAGING LIGHT EMITTING DIODE

BACKGROUND OF THE INVENTION

1. The Field of the Invention

The present invention generally relates to a wafer packaging process of packaging light-emitting diode, and more particularly to a wafer packaging process that can be performed before cutting the wafer, and the wafer is cut after completing the packaging process to form a plurality of packaged light-emitting diodes. Thus, packaging of a large number of light-emitting diodes can be performed simultaneously. Further, because the packing process is performed before the wafer cutting process, the area for processing the wafer packaging process can be larger and the wafer packaging process can be performed easily. Therefore, the packaging process time and manufacturing cost be effective reduced.

2. Description of Related Art

Presently, the light-emitting diode (LED) has the features of longer service life, faster, lower power consumption and better monochromaticity. With the development of the high intensity red, yellow and blue LED, the application of LED is expanded, for example, in large colorful signboard, information bulletin board, car, scanner, traffic lights, cellular phone and so on. According to the statistic report from Compound Semiconductor, the percentage of the applications of LED in sign display and backlight modules respectively are 32% and 27%, the percentage of application of LED is still growing along with the growing need of the LED light. The conventional packaging process of LED comprises the steps of die-attaching, wiring bonding and encapsulating. A conventional packaging process of a light-emitting diode A will now be described with reference to FIG. 1 as follows. As shown in the sectional side view in FIG. 1, the conducting wire A5 is connected to the P port and N port (not shown) of the cut die A1 respectively, and then the die A1 is mounted into an opening formed on the substrate A2. Next, a resin A4 is filled into the opening for fixing the die A1 in the opening of the substrate A2. Next, the conduct wire A5 connected to the die A1 is respectively connected with the terminal A3 connected to the substrate A2 and the terminal A3 positioned at a side of the substrate A2. Finally, the resulting structure is encapsulated using a mold A6. Thus, the packaging of the light-emitting diode A is completed.

However, the above conventional packaging of the light-emitting diode A has the following defects.

Figure 1:
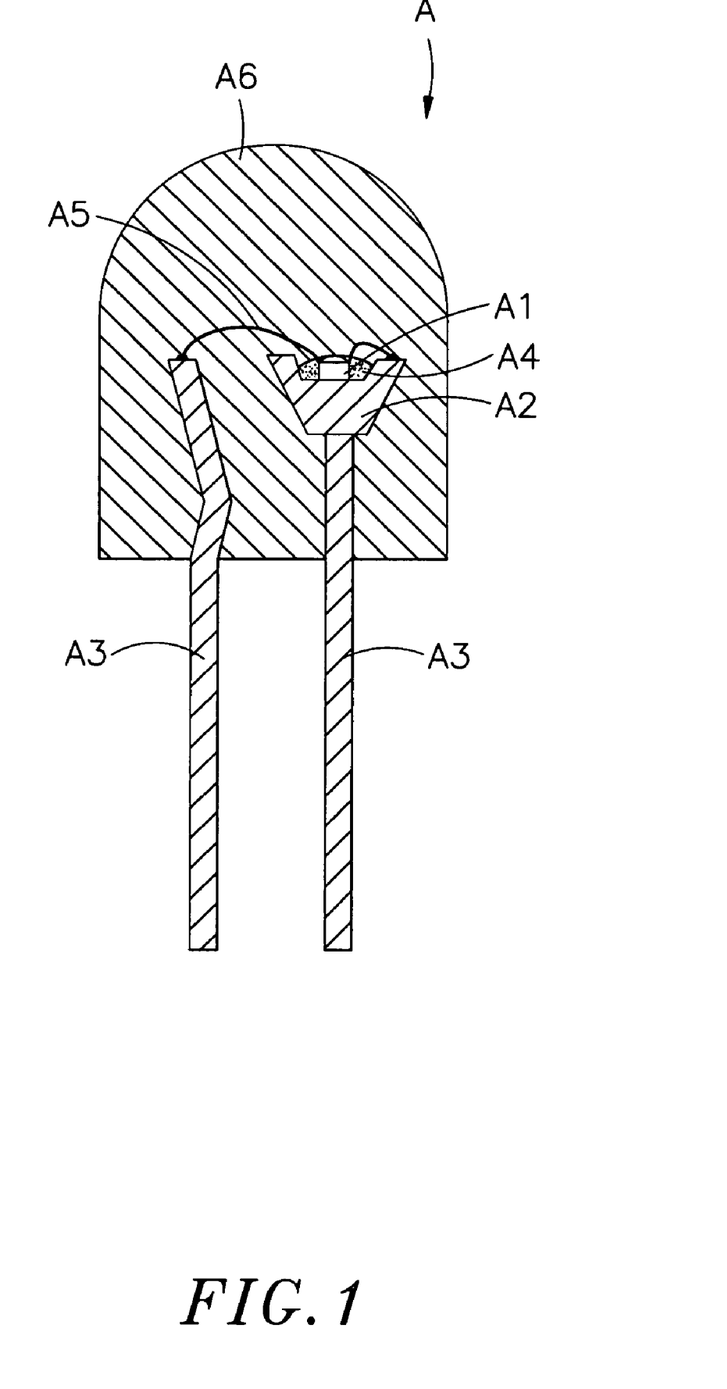
FIG. 1 is a sectional side view of a conventional LED.
Figure 2:
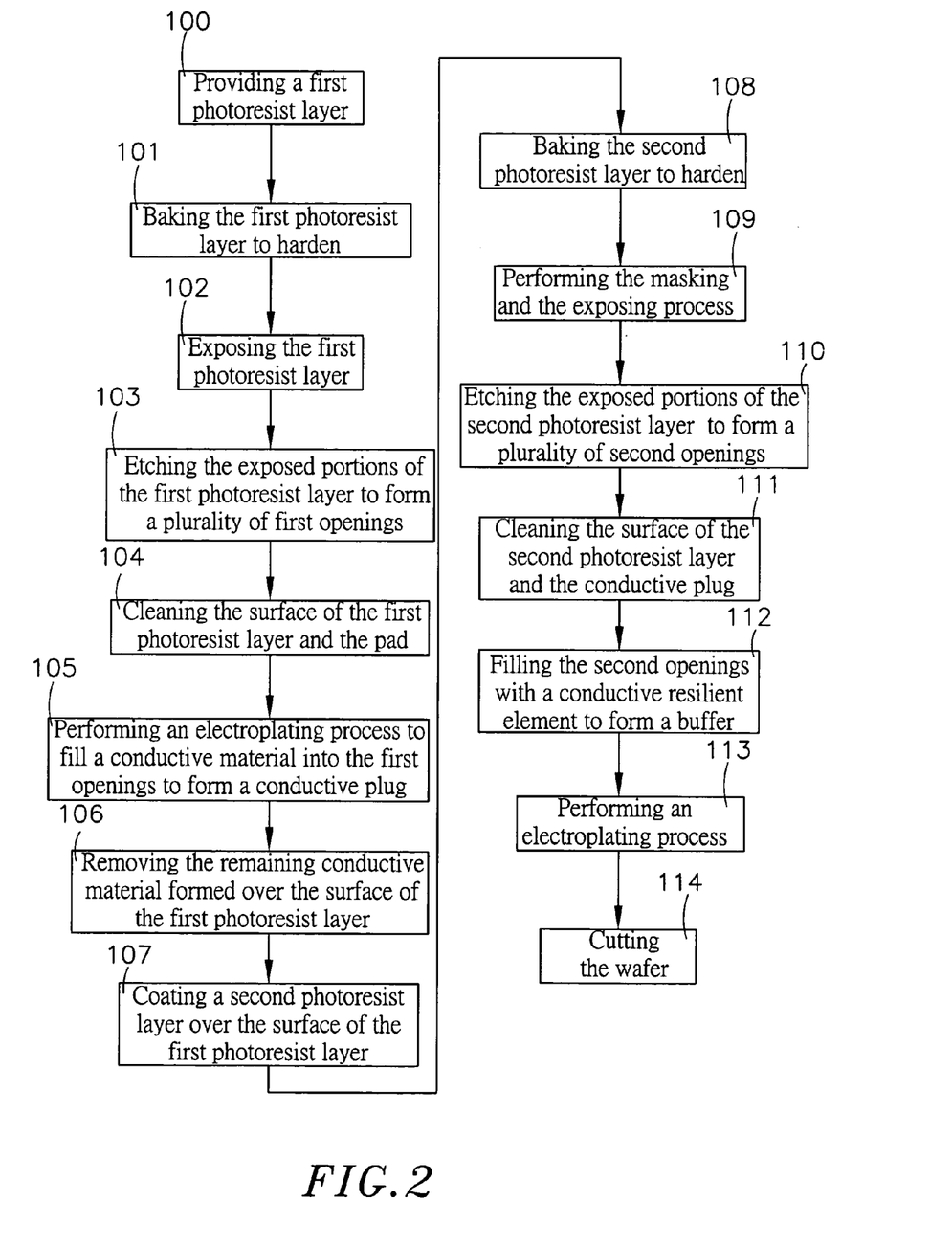
FIG. 2 is a process flowchart of a wafer packaging process of packaging LED according to a preferred embodiment of the present invention.

1. When the conventional die A1 emits light, part of the emitted light will be blocked or absorbed by the mold A6, and shadows of the conducting wire A5 are formed. Therefore, the intensity of the light-emitting diode A is substantially reduced.
2. The conventional packaging process of the light-emitting diode A needs to go through the steps of wiring bonding, however the conducting wire A5 and the die A1 are very tiny and therefore makes the wire bonding process very difficult, and accordingly, the processing time is increased and thereby the yield is substantially reduced and the overall manufacturing cost is substantially increased.
3. The conventional packaging process of the light-emitting diode A is for packaging one LED at a time, and therefore the packaging process time is accordingly more for mass production, and therefore the overall manufacturing cost is increased.
4. The conventional light-emitting diode A needs the mold A6 for securely fixing the terminal A3 and for protecting the conducting wire A5, however the mold A6 occupies a significant amount of space of the light-emitting diode A package and thereby making the size of the package larger. Therefore it not possible to further shrink the size the package.

Accordingly, how to solve the above defects has become an important issue for the manufacturer in the field.

SUMMARY OF THE INVENTION

Accordingly, in the view of the foregoing, the present inventor makes a detailed study of related art to evaluate and consider, and uses years of accumulated experience in this field, and through several experiments, to develop a new wafer packaging process of packaging of LED. The present invention provides an innovated cost effective wafer packaging process of LED that is capable of packaging a plurality of LEDs simultaneously and thereby reducing the packaging process time, increase the yield and also fit the present trend of being lighter, thinner, shorter and smaller.

According to an aspect of the present invention, packaging of LED is performed before cutting the wafer. The wafer is cut after completing the packaging process. Thus, by using the wafer packaging process of the present invention, the packaging process time can be substantially reduced and a large number of the light-emitting diodes can be packaged simultaneously. Further, because the packaging process is performed before the wafer cutting process, therefore, the area for processing can be larger and the packaging process can be implemented easily. Thus, the packaging process time can be substantially reduced and the overall manufacturing cost can be substantially reduced.

According to another aspect of the present invention, after the steps of packaging and cutting the light-emitting diode from the wafer, the light emitted by the LED can be directly emitted the surrounding area and thereby the intensity of the light emitted by the light-emitting can be fully utilized for illuminating the surrounding area.

According to another aspect of the present invention, a photoresist layer is directly coated on the wafer, and the photoresist layer is patterned and etched in a photolithography and etching process to form a conductive plug for connecting with a pad in the wafer, thus the size of the LED package can be effectively minimized.

BRIEF DESCRIPTION OF THE DRAWING

For a more complete understanding of the present invention, reference will now be made to the following detailed description of preferred embodiments taken in conjunction with the following accompanying drawings.

DETAILED DESCRIPTION OF PREFERRED EMBODIMENTS

Reference will be made in detail to the preferred embodiments of the invention, examples of which are illustrated in the accompanying drawings. Wherever possible, the same reference numbers are used in the drawings and the description to refer to the same or like parts.

Figure 3:
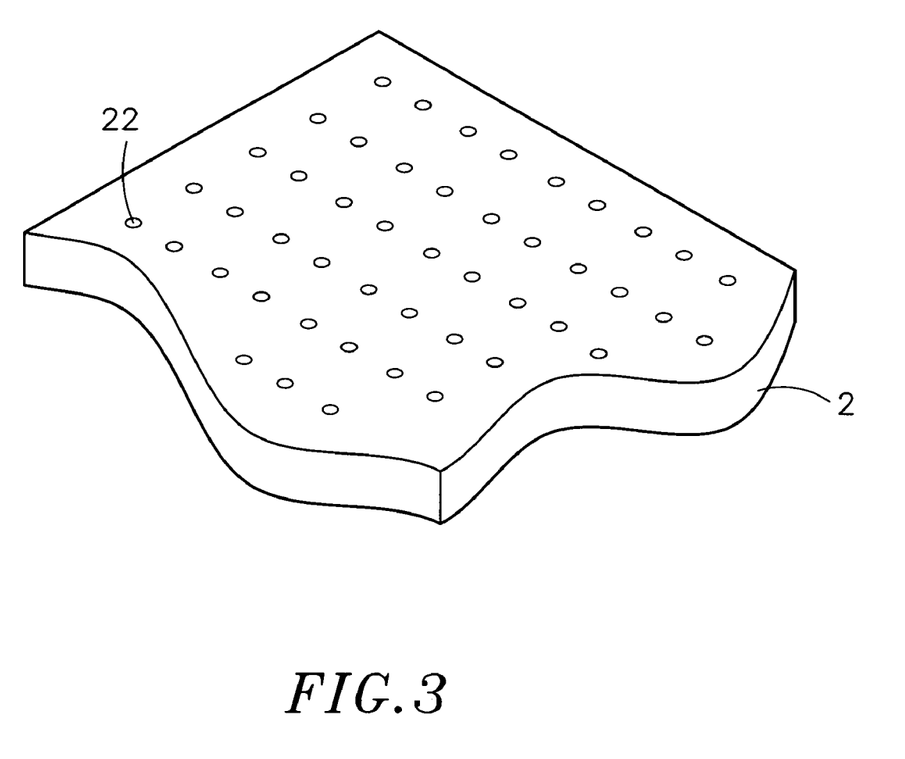
FIG. 3 is a view illustrating a process step (I) of the wafer packaging process of packaging LED according to a preferred embodiment of the present invention.
Figure 3A:
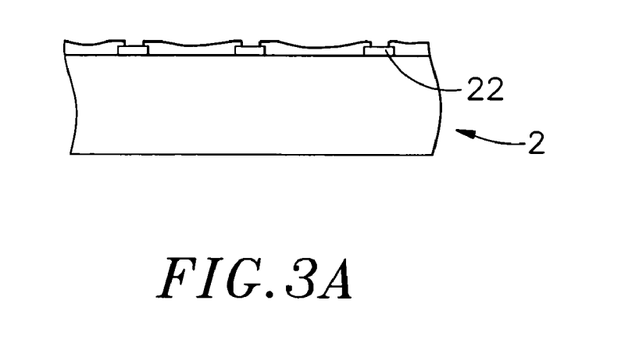
FIG. 3A is a sectional side view of FIG. 3.
Figure 4:
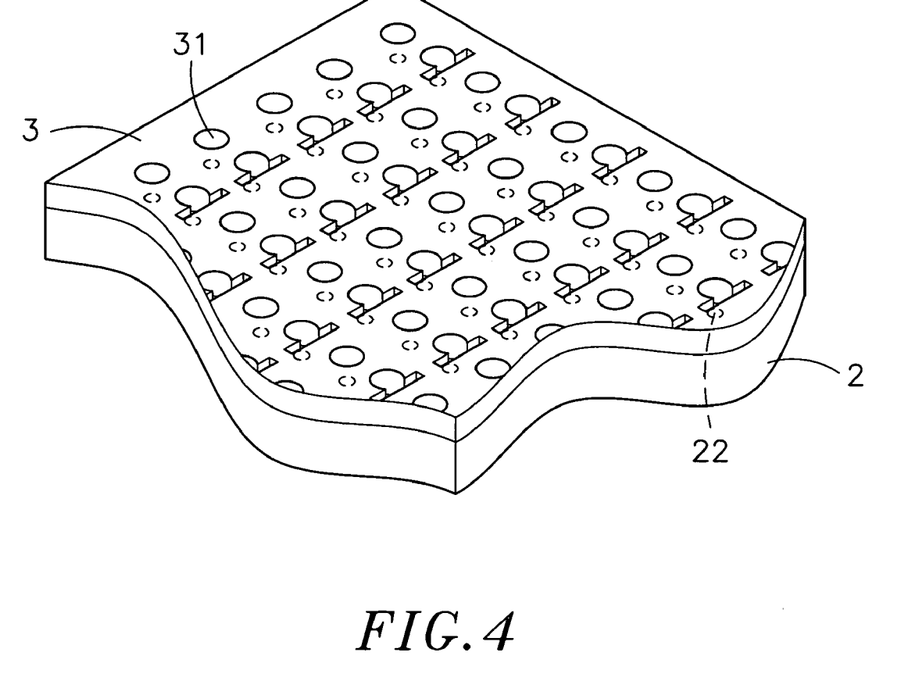
FIG. 4 is a view illustrating a process step (II) of the wafer packaging process of packaging LED according to a preferred embodiment of the present invention.
Figure 4A:
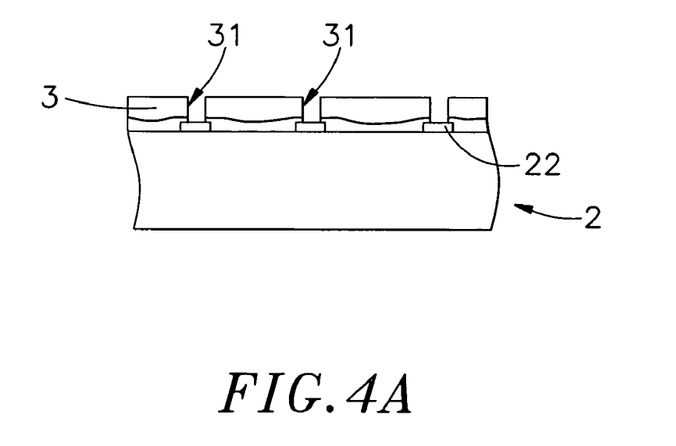
FIG. 4A is a sectional side view of FIG. 4.
Figure 5:
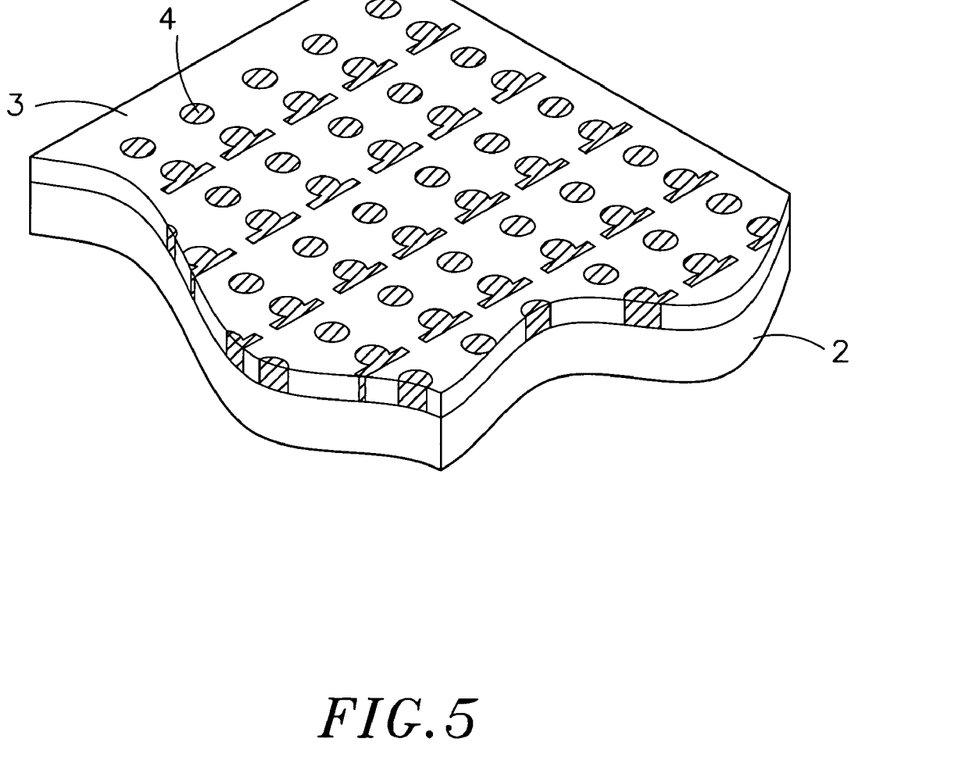
FIG. 5 is a view illustrating a process step (III) of the wafer packaging process of packaging LED according to a preferred embodiment of the present invention.
Figure 5A:
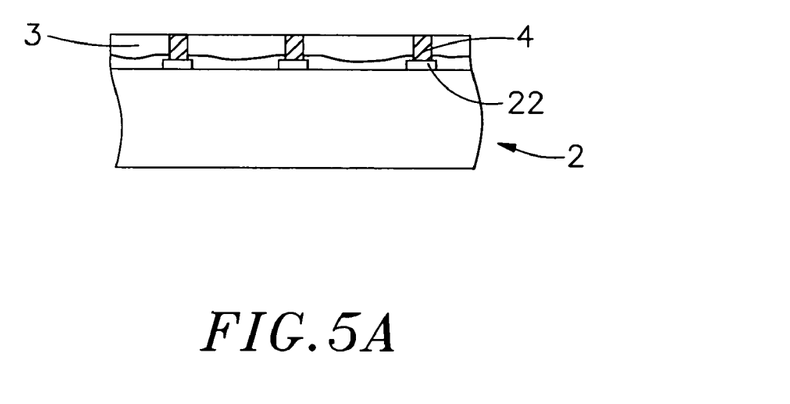
FIG. 5A is a sectional side view of FIG. 5.
Figure 6:
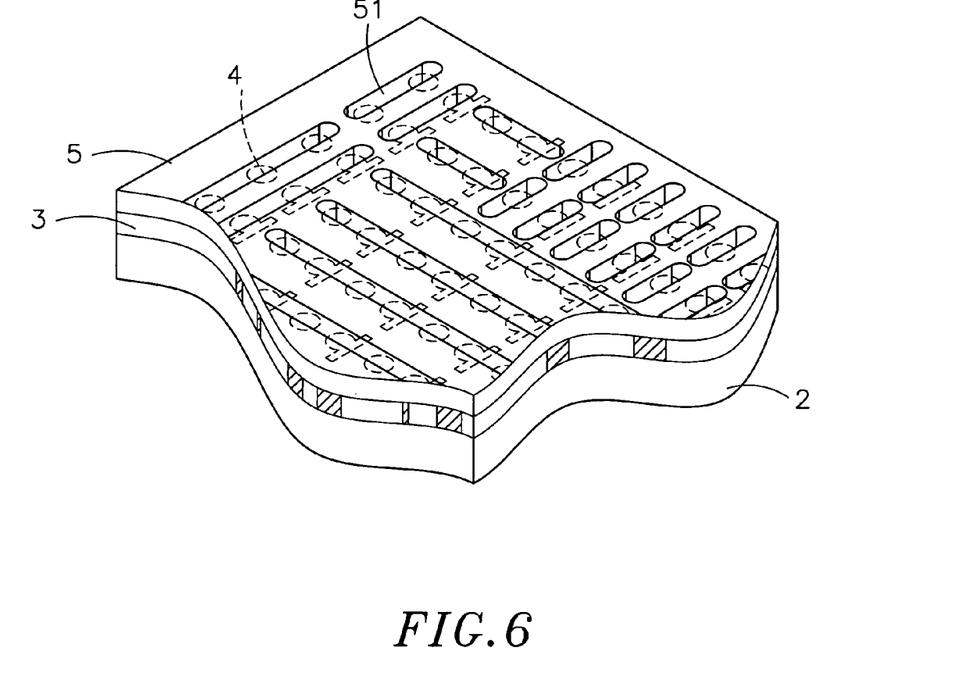
FIG. 6 is a view illustrating a process step (IV) of the wafer packaging process of packaging LED according to a preferred embodiment of the present invention.
Figure 6A:
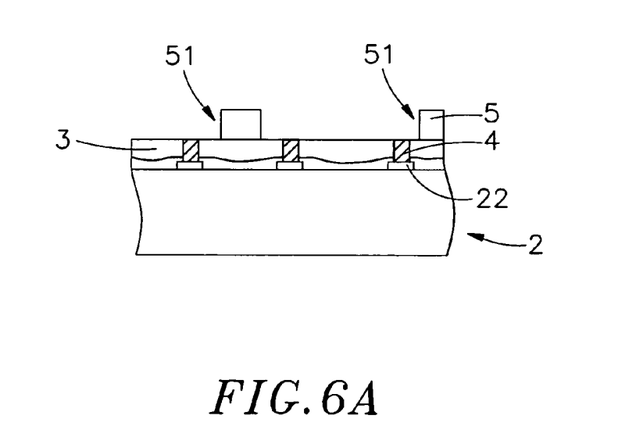
FIG. 6A is a sectional side view of FIG. 6.
Figure 7:
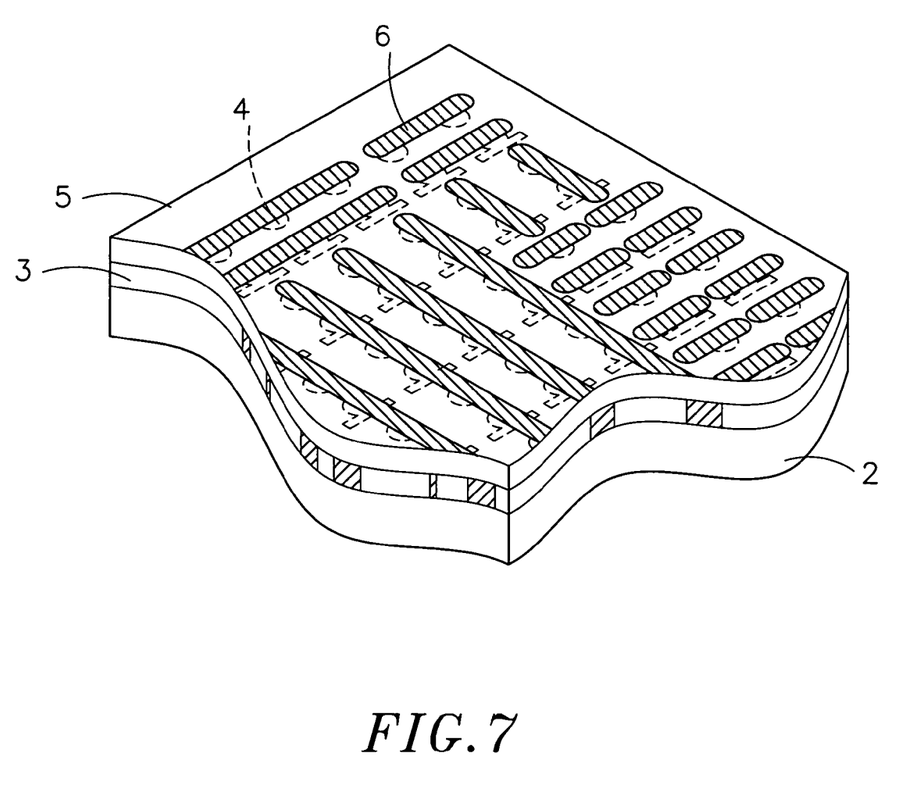
FIG. 7 is a view illustrating a process step (V) of the wafer packaging process of packaging LED according to a preferred embodiment of the present invention.
Figure 7A:
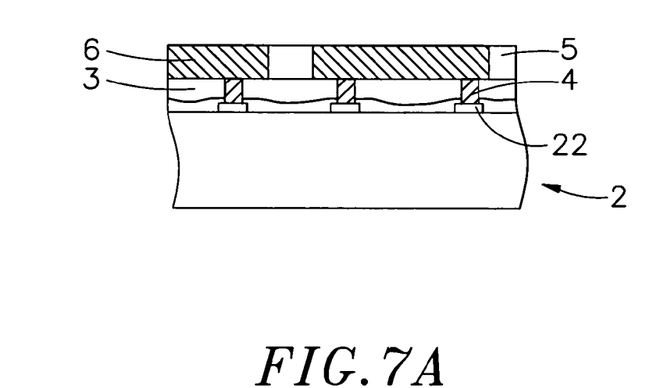
FIG. 7A is a sectional side view of FIG. 7.
Figure 8:
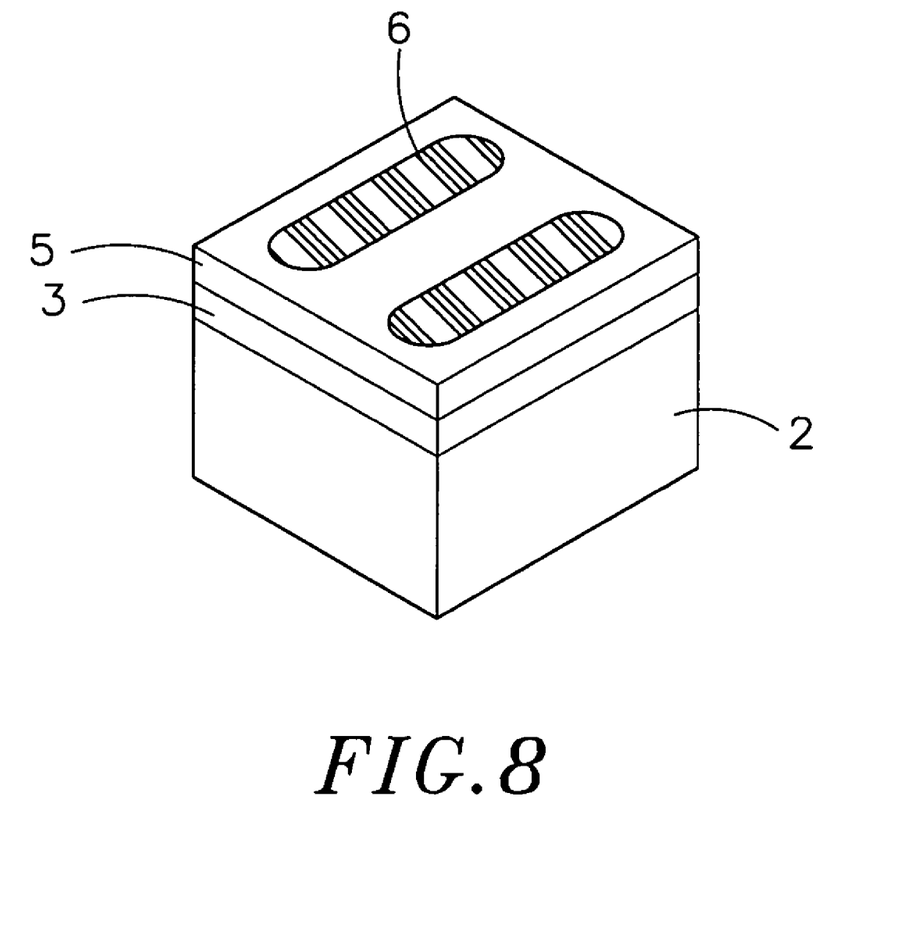
FIG. 8 is a view illustrating a process step (VI) of the wafer packaging process of packaging LED according to a preferred embodiment of the present invention.

The wafer packaging of packaging LED of the present invention is described as follows with reference to FIG. 2 and FIGS. 3–8:

providing a first photoresist layer 3 over the uncut wafer 2 having a plurality of pads 22 formed thereon, in step (100) (shown as FIGS. 3 and 3A);

coating and baking the first photoresist layer 3 (not shown) in step (101) to harden the first photoresist layer 3, in step (101);

exposing the first photoresist layer 3 using a photo mask (not shown), in step (102);

etching the exposed portions of the first photoresist layer 3 to form a plurality of first openings 31 until a portion of a pads 22 in the wafer 2 is exposed within the first openings 31, in step (103) (as shown in FIGS. 4 and 4A);

cleaning the surface of the first photoresist layer 3 and the exposed portions of pads 22 (not shown), in step (104);

performing an electroplating process to fill a conductive material into the first openings 31, in step (105), to form a conductive plug 4 electrically connecting the pads 22 in the wafer 2 (as shown in FIGS. 5 and 5A);

removing the excess conductive material formed over the surface of the first photoresist layer 3 (not shown), in step (106);

coating a second photoresist layer 5 over the surface of the first photoresist layer 3, in step (107);

baking the second photoresist layer 5 to harden the second photoresist layer 5 (not shown), in step (108);

performing the masking and the exposing process to transfer the parallel lines pattern for forming an interconnect circuit for connecting a plurality of light-emitting diodes (not shown) in step (109);

etching the exposed portions of the second photoresist layer 5 to form a plurality of second openings 51 until a portion of the conductive plug 4 is exposed within the second openings 51, in step (110) (as shown in FIGS. 6 and 6A);

cleaning the surface of the second photoresist layer 5 and the conductive plug 4, in step (111);

filling the second openings 51 with conductive resilient elements 6 to form buffers, and to electrically connect with the conductive plug 4, in step 112 (shown in FIG. 7 and 7A);

performing an electroplating process in step (113); and cutting the wafer 2 to complete the packaging process in step (114) (shown in FIG. 8).

In the present invention, the first photoresist layer 3 is used to serve as an isolation substrate, and the conductive plugs 4 is formed in the first photoresist layer 3 electrically connecting with the pad 22 in the wafer 2. Furthermore, the resilient elements 6 is electrically connected to conductive plugs 4. The resilient elements 6 serves as the buffer for the packaging process and also serves to design the conducting wires and parallel circuit for connecting multiple light-emitting diodes. The resilient elements 6 can be a silver paste or a tin paste. Additionally, an electroplating process is performed and then the wafer is cut to obtain a singlet or multiple light-emitting diodes connected in parallel. Therefore, by supplying a voltage to the circuit, the light-emitting diode(s) can be activated to emit light. Furthermore, the circuit can be utilized to connect a plurality of light-emitting diodes in series or in parallel so that the number of circuits of the electronic appliance can be substantially reduced.

Figure 9:
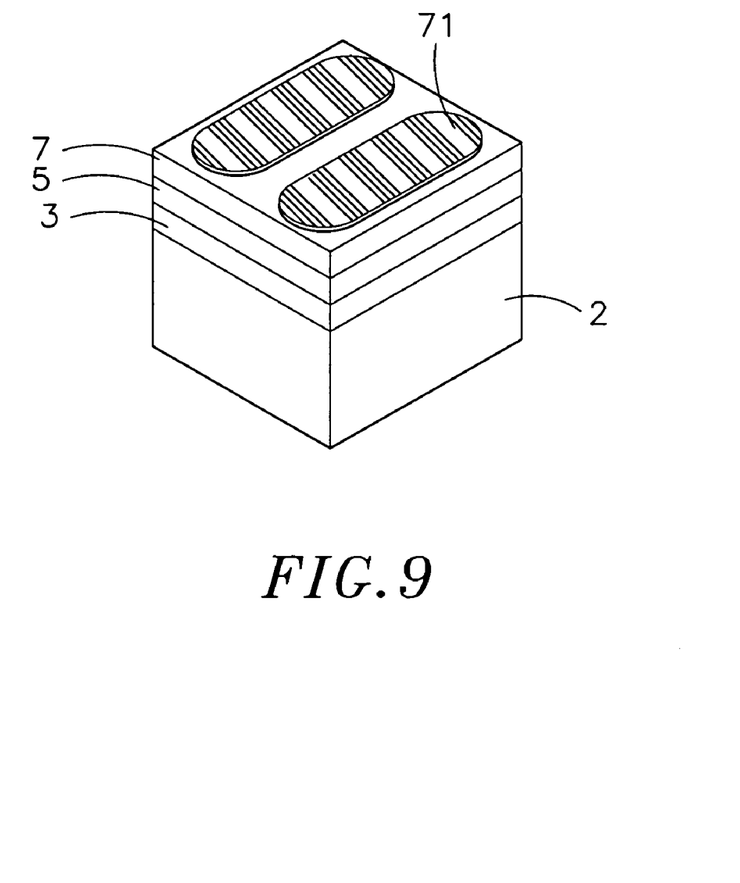
FIG. 9 is a view of a LED package according to a preferred embodiment of the present invention.
Figure 9A:
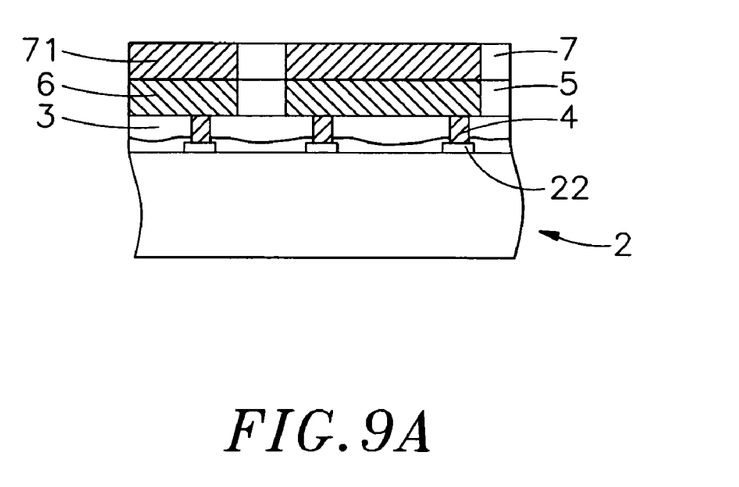
FIG. 9A is a sectional side view of FIG. 9.

Additionally, a third photoressist layer 7 can be patterned and etched to form the parallel line patterns for forming interconnect circuit according to the requirements before cutting the wafer 2 and the solders 71 is deposited over the circuit electrically connecting with the circuit as shown in FIGS. 9 and 9A. After cutting the wafer 2 to obtain singlet or multiple light emitting diodes, the light-emitting diode(s) is ready for connecting directly onto the circuit board by connecting the solders 71 or connecting the terminal of the circuit board to the solders 71. The solders 71 can be comprised of a tin paste or a tin ball.

The wafer 2 used in the present invention is similar to the wafer used in die of a general light-emitting diode, and the die of the present invention are formed after cutting the wafer 2.

The wafer packaging process of packaging LED of the present invention at least have the following advantages:

1. The first photoresist layer 3 is directly coated on a surface of the wafer 2, and the first photoresist layer 3 is patterned and etched to form conductive plugs 4 to electrically connect the pad 22 in the wafer 2. Furthermore, the conductive resilient elements 6 deposited on the conductive plugs 4 can be connected to an external circuit to receive a voltage to activate the light-emitting diode to emit light. Further, the LED package is not encapsulated by a resin mold, and therefore the light emitted by the light-emitting diode can be fully utilized for illuminating the surrounding. Furthermore, the steps of bonding the conducting wire, forming the terminals and encapsulation as in the case of the conventional process of packaging the LED can be effectively avoided, and therefore the size of the LED package can be substantially reduced.

2. The wafer packaging process of LED of the present invention is performed before cutting the wafer 2, and therefore the packaging of the large number of light emitting diodes can be performed simultaneously, and therefore a large number of LED ready for use can be obtained after cutting the wafer. Therefore, the area for processing the packaging can be larger and the packaging process is simplified and can be easily performed and thereby effectively reducing the overall packaging process time and reducing the manufacturing cost.

3. A plurality of light-emitting diodes can be connected in series or in parallel by connecting to circuit formed by the resilient elements 6, and therefore, the number of the circuits in an electronic appliance can be substantially reduced.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What is claimed is:

1. A wafer packaging process of packaging light-emitting diode, comprising:
   providing a wafer having at least a pad formed thereon,
   forming a patterned photoresist layer formed on a surface of said wafer, wherein at least an opening is formed in said patterned photoresist layer exposing a portion of said pad therein;
   forming at least a conductive plug in said opening of said patterned photoresist electrically connecting a pad in said wafer; and
   forming a resilient element on said conductive plug and electrically connecting said conductive plug.

2. The wafer packaging process of packaging light-emitting diode according to claim 1, wherein said conductive plug is formed by etching an opening in said photoresist layer and filling a conductive material in said opening by performing an electroplating process.

3. The wafer packaging process of packaging light-emitting diode according to claim 1, wherein said resilient element comprises a silver paste.

4. The wafer packaging process of packaging light-emitting diode according to claim 1, wherein said resilient element comprises a tin paste.

5. The wafer packaging process of packaging light-emitting diode according to claim 1, further comprising the step of forming a solder on an upper surface of said resilient element.

6. The wafer packaging process of packaging light-emitting diode according to claim 5, wherein said solder comprises a tin paste.

7. The wafer packaging process of packaging light-emitting diode according to claim 5, wherein said solder comprises a tin ball.

8. A wafer packaging process of packaging light-emitting diode, comprising:
   (a) coating a first photoresist layer on an uncut wafer having a plurality of pads formed thereon;
   (b) etching said first photoresist layer for forming a plurality of first openings until a portion of said pad within said first openings are exposed;
   (c) performing an electroplating process for filling a conductive material in said first openings to form a plurality of conductive plugs electrically connecting with said pads;
   (d) coating a second photoresist layer on a surface of said first photoresist layer;
   (e) etching said second photoresist layer for forming a plurality of second openings until a portion of said conductive plugs is exposed within said second openings;
   (f) filling said second openings with a conductive resilient element;
   (g) performing an electroplating process; and
   (g) cutting said wafer to form a plurality of packaged light emitting diodes.

9. The wafer packaging process of packaging light-emitting diode according to claim 8, wherein after said step (a) further comprising baking said photoresist layer to harden said first photoresist layer.

10. The wafer packaging process of packaging light-emitting diode according to claim 8, wherein said step (b) comprises the steps of using a photo mask to expose said first photoresist layer and etching the exposed portions of said first photoresist layer to form said first openings.

11. The wafer packaging process of packaging light-emitting diode according to claim 8, wherein before said step (c) further comprising a step of cleaning a surface of said first photoresist layer and exposed portions of said pad.

12. The wafer packaging process of packaging light-emitting diode according to claim 8, wherein after said step (d) further comprising a step of baking said second photoresist layer to harden said second photoresist layer.

13. The wafer packaging process of packaging light-emitting diode according to claim 8, wherein said step (e) comprises the steps of using a photo mask to expose said second photoresist layer and etching the exposed portions of said second photoresist layer to form said second openings.

* * * * *